United States Patent [19]

Kobayashi et al.

[11] Patent Number: 6,074,695
[45] Date of Patent: Jun. 13, 2000

[54] COMPOSITION AND PROCESS FOR FORMING ELECTRICALLY INSULATING THIN FILMS

[75] Inventors: Akihiko Kobayashi; Katsutoshi Mine; Takashi Nakamura; Motoshi Sasaki; Kiyotaka Sawa, all of Chiba Prefecture, Japan

[73] Assignee: Dow Corning Toray Silicone Co., Ltd., Tokyo, Japan

[21] Appl. No.: 09/052,379

[22] Filed: Mar. 31, 1998

[30] Foreign Application Priority Data

Mar. 31, 1997 [JP] Japan .................................. 9-096476

[51] Int. Cl.[7] ....................................................... B05D 5/00
[52] U.S. Cl. ......................... 427/245; 427/244; 427/335; 427/373; 521/64; 521/86; 521/88; 521/90; 521/91; 521/97
[58] Field of Search .................................. 521/64, 88, 86, 521/90, 91, 97; 427/244, 245, 335, 373

[56] References Cited

U.S. PATENT DOCUMENTS

| | | | |
|---|---|---|---|
| 3,615,272 | 10/1971 | Collins et al. | 23/366 |
| 4,756,977 | 7/1988 | Haluska et al. | 428/704 |
| 5,238,787 | 8/1993 | Haluska et al. | 430/325 |
| 5,416,190 | 5/1995 | Mine et al. | 528/492 |
| 5,548,159 | 8/1996 | Jeng | 257/634 |
| 5,840,774 | 11/1998 | Ehrlich et al. | 521/64 |

FOREIGN PATENT DOCUMENTS

| | | | |
|---|---|---|---|
| 0 492 826 A2 | 7/1992 | European Pat. Off. | C23C 18/02 |
| 0 736 584 A2 | 10/1996 | European Pat. Off. | C09D 183/04 |
| 59-189126 | 10/1984 | Japan | C08G 71/12 |
| 60-042426 | 6/1985 | Japan | C08G 77/12 |

OTHER PUBLICATIONS

43RD Extended Abstracts of the Japn Society of Applied Physics and Related Societies, p. 654, Abstract 26a–N–6.
Pg 116 of the 1995 Proceedings of the Twelfth International VLSI Multilevel Interconnected Conference.

*Primary Examiner*—Melvyn I. Marquis
*Attorney, Agent, or Firm*—Severance K. Severance; Roger E. Gobrogge; Rick D. Streu

[57] ABSTRACT

To provide a composition for the formation of insulating films that can form an insulating film having a low dielectric constant. The composition comprises (A) an electrically insulating curable resin selected from the group consisting of electrically insulating curable organic resins and electrically insulating curable inorganic resins; and (B) at least two solvents: (B)(i) a solvent capable of dissolving resin (A) and (B)(ii) a solvent whose boiling point or vapor pressure curve differs from that of solvent (B)(i) or whose affinity for resin (A) differs from that of solvent (B)(i). Also claimed is a method for forming a insulating films that have a dielectric constant of less than 2.7.

20 Claims, No Drawings

COMPOSITION AND PROCESS FOR FORMING ELECTRICALLY INSULATING THIN FILMS

FIELD OF THE INVENTION

This invention relates to a composition for the formation of electrically insulating thin films and to a process for the formation of electrically insulating thin films. More particularly, this invention relates to a composition and process for the formation of insulating thin films that have low dielectric constants.

BACKGROUND OF THE INVENTION

Insulating thin films of silica are known for use as protective layers and as electrically insulating layers in electronic devices. The wet-coating of compositions comprising resin and solvent is generally and widely employed in this field. For example, U.S. Pat. No. 4,756,977 teaches a process for coating electronic devices with a silica thin film by applying a solvent solution of hydrogen silsesquioxane resin on a substrate, evaporating the solvent, and heating at temperatures of 150° C. to 1,000° C. to effect conversion into ceramic-like silica. Lower dielectric constants have been required from these insulating layers as devices have shrunk in size and become more highly integrated. For example, a dielectric constant of 2.7 has been reported for a thin film afforded by the cure of hydrogen silsesquioxane (43rd Extended Abstracts of the Japan Society of Applied Physics and Related Societies, page 654, Abstract 26a-N-6). However, dielectric constants below 2.7 are required of the electrically insulating thin films in the next-generation highly integrated circuits with design rules narrower than 0.18 μm. Nevertheless, to date no process has been discovered for the stable and highly reproducible generation of such low dielectric constants in the electrically insulating thin films suitable for highly integrated circuits, for example, in silica films.

On the other hand, it is known that the insulating thin film can itself be executed as a porous structure in order to reduce the dielectric constant of the insulating thin film. For example, U.S. Pat. No. 5,548,159 has reported the formation of an insulating thin film with a porous structure through the use of the baked product of hydrogen silsesquioxane resin as the dielectric layer in a highly integrated circuit. U.S. '159, however, does not disclose a specific method for the formation of the porous structure. Therefore, a composition and process capable of forming an electrically insulating thin film with a low dielectric constant (a dielectric constant materially below 2.7) is not known.

It is an object of this invention is to provide a composition and process that can produce an electrically insulating thin film with a low dielectric constant, specifically with a dielectric constant below 2.7.

SUMMARY OF THE INVENTION

This invention relates to an insulating thin film-forming composition comprising
(A) a resin selected from the group consisting of electrically insulating curable organic resins and electrically insulating curable inorganic resins; and
(B) a solvent mixture comprising
  (i) a solvent capable of dissolving resin (A) and
  (ii) a solvent whose boiling point or vapor pressure curve or affinity for resin (A) differs from that of solvent (i).

The composition is useful for the formation of electrically insulating thin films that have low dielectric constants (<2.7).

DETAILED DESCRIPTION OF THE INVENTION

The present invention relates to an insulating thin film-forming composition that comprises
(A) a resin selected from the group consisting of electrically insulating curable organic resins and electrically insulating curable inorganic resins; and
(B) a solvent mixture comprising
  (i) a solvent capable of dissolving resin (A) and
  (ii) a solvent whose boiling point or vapor pressure curve or affinity for resin (A) differs from that of solvent (i).

Resin (A) can be inorganic or organic and is not critical as long as it is solvent soluble, can be cured by heating after its application, and provides insulation. The resin can be exemplified by the partial hydrolyzates of alkoxysilanes, by inorganic resins that are silica precursor resins such as hydrogen silsesquioxane resin, and by organic resins such as polyimide resins, fluorocarbon resins, benzocyclobutene resins, and fluorinated polyallyl ethers. This resin can take the form of a single resin or a mixture of two or more resins. Silica precursor resins, with their ability to cure into silica, provide particularly good electrical insulating properties and are therefore preferred.

Among the silica precursor resins, hydrogen silscsquioxane resins, which can be used in a non-etchback process, are particularly preferred. The hydrogen silsesquioxane resin used in the present invention is polysiloxane whose main skeleton is composed of the trifunctional siloxane unit $HSiO_{3/2}$ and is a polymer with the general formula $(HSiO_{3/2})_n$, in which the subscript n is a positive integer. From the standpoint of molecular structure, this hydrogen silsesquioxane resin includes so-called ladder-type polysiloxanes and cage-type polysiloxanes. The terminals of the ladder-type polysiloxanes can be endblocked by, for example, the hydroxyl group, a triorganosiloxy group such as the trimethylsiloxy group, or a diorganohydrogensiloxy group such as the dimethylhydrogensiloxy group.

Hydrogen silsesquioxane resin is known and in general can be synthesized by the hydrolysis of trichlorosilane and ensuing polycondensation (see U.S. Pat. No. 3,615,272 and Japanese Patent Application Laid Open (Kokai or Unexamined) Numbers Sho 59-189126 (189,126/1984) and Sho 60-42426 (42,426/1985)).

The solvent mixture (B) comprises a solvent (B)(i) and a solvent (B)(ii). The solvent (B)(i) should be capable of dissolving resin (A) without the occurrence of chemical changes, but is not otherwise critical. Solvent (B)(i) maybe exemplified by aromatic solvents such as toluene, xylene, and so forth; aliphatic solvents such as hexane, heptane, octane, and so forth; ketone solvents such as methyl ethyl ketone, methyl isobutyl ketone, and so forth; aliphatic ester solvents such as butyl acetate, isoamyl acetate, and so forth; and silicone solvents such as chain methylsiloxanes like hexamethyldisiloxane and 1,1,3,3-tetramethyldisiloxane, cyclic siloxanes like 1,1,3,3,5,5,7,7-octamethyltetracyclosiloxane and 1,3,5,7-tetramethyltetracyclosiloxane, and silanes such as tetraethylsilane and dimethyldiethylsilane. Methyl isobutyl ketone and the silicone solvents are preferred.

Solvent (B)(ii) is solvent whose boiling point or vapor-pressure curve or affinity for the resin (A) differs from that of solvent (B)(i). A solvent (B)(ii) with a boiling point higher than that of solvent (B)(i) is generally preferred. The solvent (B)(ii) is exemplified by the following (the value in parentheses is the boiling point of the compound): hydrocarbon solvents such as amylbenzene (202° C.), isopropylbenzene (152° C.), 1,2-diethylbenzene (183° C.), 1,3-diethylbenzene (181° C.), 1,4-diethylbenzene (184° C.), cyclohexylbenzene (239° C.), dipentene (177° C.), 2,6-dimethylnaphthalene (262° C.), p-cymene (177° C.), camphor oil (160–185° C.), solvent naphtha (110–200° C.), cis-decalin (196° C.), trans-decalin (187° C.), decane (174° C.), tetralin (207° C.), turpentine oil (153–175° C.), kerosene (200–245° C.), dodecane (216° C.), dodecylbenzene (branched), and so forth; ketone and aldehyde solvents such as acetophenone (201.7° C.), isophorone (215.3° C.), phorone (198–199° C.), methylcyclohexanone (169.0–170.5° C.), methyl n-heptyl ketone (195.3° C.), and so forth; ester solvents such as diethyl phthalate (296.1° C.), benzyl acetate (215.5° C.), γ-butyrolactone (204° C.), dibutyl oxalate (240° C.), 2-ethylhexyl acetate (198.6° C.), ethyl benzoate (213.2° C.), benzyl formate (203° C.), and so forth; diethyl sulfate (208° C.), sulfolane (285° C.), and halohydrocarbon solvents; etherified hydrocarbon solvents; alcohol solvents; ether/acetal solvents; polyhydric alcohol solvents; carboxylic anhydride solvents; phenolic solvents; and silicone solvents. While the quantity of addition of solvent mixture (B) is not crucial, solvent mixture is in general preferably added at no more than 50 parts per 100 weight parts component (A). Preferably the amount of (B)(ii) is less than the amount of (B)(i), more preferably from 1.3 to 13.3 wt% based on the total weight of (B).

Solvent mixture (B) is not simply employed in the present invention as a solvent for the resin (A). As discussed in the following, solvent (B) is gasified and expelled from the system during or after the cure of the resin (A), thereby leaving voids or free spaces in the electrically insulating thin film and as a result generating a low-dielectric constant electrically insulating thin film. A major fraction of the main solvent will evaporate immediately after coating on the substrate, but a portion remains in the film and this residual solvent behaves as described above. However, in order to efficiently achieve the object described above, solvent mixture (B) contains not just the main solvent (B)(i), but rather is a mixture with at least 1 selection from solvents (B)(ii) that have a higher boiling point than the main solvent, or that have a different vapor-pressure curve, i.e., that are more difficult to evaporate, or that have a different affinity for the resin (A). This solvent (B)(ii) remains in larger amounts in the film immediately after the composition has been coated on the substrate and will also be evaporated and expelled from the system during or after cure of the resin. The type of solvent (B)(ii) is not crucial, but it should be selected to obtain an optimal relationship with the curing temperature of the resin.

Component (C) is a component added on an optional basis for the purpose of accelerating the cure of resin (A). Cure accelerator (C) is used when, based on considerations of striking a good balance with the gas-generating temperature of component (B), it becomes necessary to preliminarily induce partial crosslinking of component (A) at lower temperatures. When hydrogen silsesquioxane resin is used as component (A), cure accelerator (C) is preferably a platinum catalyst such as chloroplatinic acid or a rhodium catalyst. Such a cure accelerator (C) is used at from 1 to 500 weight parts for each 1,000,000 weight parts resin (A).

In addition, in some cases an assistant, e.g., a stabilizer such as surfactant, may be added to assist the dispersion of solvent mixture (B).

When hydrogen silsesquioxane resin is used as resin (A), heating the composition results in the formation of an electrically insulating thin film, for example, a silica film. As used herein, silica refers to silicon dioxide ($SiO_2$) and includes both amorphous silica and amorphous silica that is not completely free of silanol and/or hydrogen. In the event of the addition of ceramic precursors, the silica will also contain the corresponding compounds.

Substrates that may be used in the process according to the present invention are exemplified by ceramic substrates, various metal substrates, and electronic devices, preferably electronic devices.

The process for the formation of electrically insulating thin films comprises (I) coating the surface of a substrate with a composition for forming electrically insulating thin films that comprises
  (A) an electrically insulating curable resin selected from electrically insulating inorganic resins and electrically insulating organic resins; and
  (B) a solvent mixture comprising (i) a solvent capable of dissolving component (A) and (ii) a solvent whose boiling point or vapor pressure curve differs from that of solvent (B)(i) or whose affinity for resin (A) differs from that of solvent (B)(i);
(II) evaporating at least a portion of the solvent mixture (B); and
(III) subsequently heating the substrate to induce gasification of the remaining solvent
  (B) during the course of or after the cure of the said resin (A).

The insulating thin film-forming composition comprising (A) and (B) is coated on the surface of a substrate and a portion of the solvent mixture (B) is evaporated. Applicable coating methods are exemplified by spin coating, dipping, spraying, and flow coating. The method for evaporating a portion of the solvent mixture (B) is not critical and can be exemplified by standing at ambient or elevated temperature and drying in air, under reduced pressure, or under a gas current. During this step of evaporating a portion of (B) gas is generated and a portion thereof is expelled from the system with the corresponding formation of hollow porous structures or free spaces in the insulating film.

The substrate is subsequently heated in order to gasify the remaining solvent mixture (B) during or after the cure of the resin (A). The heating temperature for this is not critical as long as a temperature is used that results in gasification of solvent mixture (B). However, heating must be carried out to a temperature higher than the melting point of resin (A) when depending on the particular objective it is desired for the electrically insulating thin film to melt planarize the substrate. The means used for heating is again not crucial, and the heaters in general use, such as ovens, hot plates, and so forth, can be used.

The insulating thin film-forming composition has the ability to form low-dielectric constant insulating thin films and is useful for those applications that require such properties, for example, as a commercial method for producing low-dielectric constant insulating thin films on substrates such as electronic devices and so forth.

EXAMPLES

So that those skilled in the art can understand and appreciate the invention taught herein, the following examples are presented, it being understood that these examples should not be used to limit the scope of this invention found in the claims.

The conversion to silica in the examples was evaluated by measuring the residual SiH% in the film using Fourier transform infrared absorption spectroscopic analysis. The residual SiH% in the film was calculated using 100% for the SiH% after spin coating. The dielectric constant was measured at 25° C. and 1 megahertz on a sample formed on a silicon wafer with a resistivity of $10^{-2}\Omega\cdot$cm. The measurement was run by the sandwich method using aluminum electrodes and an impedance analyzer.

Example 1

Hydrogen silsesquioxane resin was synthesized by the method described in Example 1 of Japanese Patent Publication (Kokoku) Number Sho 47-31838 (U.S. Pat. No. 3,615,272). Analysis of the hydrogen silsesquioxane resin product by gel permeation chromatography (GPC) gave a number-average molecular weight of 1,540 and a weight-average molecular weight of 7,705. The hydrogen silsesquioxane resin was subjected to a molecular weight fractionation according to the method described in Example 1 of Japanese Patent Application Laid Open (Kokai or Unexamined) Number Hei 6-157760 (U.S. Pat. No. 5,416,190). Analysis of the hydrogen silsesquioxane resin in the recovered fraction ("H-resin fraction") by GPC gave a number-average molecular weight of 5,830 and a weight-average molecular weight of 11,200. The conditions in the GPC measurements are:

instrument: 802A from the Tosoh Corporation column: G3000/G4000/G5000/G6000 carrier solvent: toluene column temperature: 30° C.

molecular weight standard: polystyrene detection: differential refractometer sample: 2 wt % solids (toluene solution)

The H-resin fraction was dissolved in methyl isobutyl ketone to prepare the 22 wt % (solids) solution. To this was added dodecylbenzene at 1 wt % based on the methyl isobutyl ketone solution and chloroplatinic acid hexahydrate at 100 weight-ppm based on the H-resin the fraction. A film with a thickness of 6,060 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was baked in a quartz oven under an air current at 250° C. for 1 hour, removed, and allowed to stand for 10 minutes at room temperature. At this point the solubility of the film in methyl isobutyl ketone was lower than that post-spin coating. The wafer was annealed for 1 hour in a quartz oven at 400° C. under a current of nitrogen containing 10 ppm oxygen, withdrawn and allowed to stand at room temperature for 10 minutes. The residual SiH% in the insulating film was 74%, confirming that conversion to silica had occurred. No abnormalities, i.e., cracks and so forth, were observed in the film. The dielectric constant of the film was 2.4.

Example 2

The H-resin fraction prepared in Example 1 was dissolved in methyl isobutyl ketone to prepare the 22 wt % (solids) solution. To this was added dodecylbenzene at 10 wt % based on the methyl isobutyl ketone solution and chloroplatinic acid hexahydrate at 100 weight-ppm based on the H-resin fraction. A film with a thickness of 6,500 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was baked in a quartz oven under an air current at 250° C. for 1 hour, removed, and allowed to stand for 10 minutes at room temperature. At this point the solubility of the film in methyl isobutyl ketone was lower than that post-spin coating. The wafer was annealed for 1 hour in a quartz oven at 400° C. under a current of nitrogen containing 10 ppm oxygen, withdrawn and allowed to stand at room temperature for 10 minutes. The residual SiH% in the film was 79%, confirming that conversion to silica had occurred. No abnormalities, i.e., cracks and so forth, were observed in the film. The dielectric constant of the film was 2.4.

Example 3

The H-resin fraction prepared in Example 1 was dissolved in methyl isobutyl ketone to prepare the 35 wt % (solids) solution. To this was added dodecylbenzene at 10 wt % based on the prepared methyl isobutyl ketone solution and chloroplatinic acid hexahydrate at 100 weight-ppm based on the H-resin fraction. A film with a thickness of 13,700 angstroms was produced by spin coating the solution on a silicon wafer at a preliminary rotation of 500 rpm for 3 seconds and then at a main rotation of 2,000 rpm for 10 seconds followed by standing for 10 minutes at room temperature. The wafer was baked in a quartz oven under an air current at 250° C. for 1 hour, removed, and allowed to stand for 10 minutes at room temperature. At this point the solubility of the film in methyl isobutyl ketone was lower than that post-spin coating. The wafer was annealed for 1 hour in a quartz oven at 400° C. under a current of nitrogen containing 10 ppm oxygen, withdrawn and allowed to stand at room temperature for 10 minutes. The residual SiH% in the insulating film was 79%, confirming that conversion to silica had occurred. No abnormalities, i.e., cracks and so forth, were observed in the film. The dielectric constant of the film was 2.4.

Example 4

The H-resin fraction prepared in Example 1 was dissolved in methyl isobutyl ketone to prepare the 22 wt % (solids) solution. To this was added diethyl phthalate at 10 wt % based on the methyl isobutyl ketone solution and chloroplatinic acid hexahydrate at 100 weight-ppm based on the H-resin fraction. A film with a thickness of 6,300 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was baked in a quartz oven under an air current at 250° C. for 1 hour, removed, and allowed to stand for 10 minutes at room temperature. At this point the solubility of the film in methyl isobutyl ketone was lower than that post-spin coating. The wafer was annealed for 1 hour in a quartz oven at 400° C. under a current of nitrogen containing 10 ppm oxygen, withdrawn and allowed to stand at room temperature for 10 minutes. The residual SiH% in the insulating film was 78%, confirming that conversion to silica had occurred. No abnormalities, i.e., cracks and so forth, were observed in the film. The dielectric constant of the insulating film was 2.4.

Example 5

Hydrogen silsesquioxane resin was synthesized by the method described in Example 1 of Japanese Patent Publication (Kokoku) Number Sho 47-31838 (U.S. Pat. No. 3,615,272). Analysis of the hydrogen silsesquioxane resin product by GPC gave a number-average molecular weight of 1,540, a weight-average molecular weight of 7,705, and a value of 41 wt % for the content of component with a molecular weight no greater than 1,500. The hydrogen silsesquioxane resin was subjected to a molecular weight fractionation according to the method described in Example 1 of Japanese Patent Application Laid Open (Kokai or Unexamined) Number Hei 6-157760 (U.S. Pat. No. 5,416, 190). Analysis of the hydrogen silsesquioxane resin in the recovered fraction ("H-resin fraction") by GPC gave a number-average molecular weight of 743, a weight-average molecular weight of 1,613, and a value of 72 wt % for the content of component with a molecular weight no greater than 1,500. The conditions in the GPC measurements were the same as reported in Example 1.

This fraction was dissolved in hexamethyldisiloxane/ octamethyltrisiloxane mixed solvent (30/70) to prepare the 30% (solids) solution. To this was added dodecylbenzene at 10 wt % based on the hexamethyldisiloxane/ octamethyltrisiloxane solution and chloroplatinic acid hexahydrate at 100 weight-ppm based on the H-resin fraction. A film with a thickness of 6,320 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was baked in a quartz oven under an air current at 200° C. for 1 hour, removed, and allowed to stand for 10 minutes at room temperature. At this point the solubility of the film in methyl isobutyl ketone was lower than that post-spin coating. The wafer was annealed for 1 hour in a quartz oven at 400° C. under a current of nitrogen containing 10 ppm oxygen, withdrawn and allowed to stand at room temperature for 10 minutes. The residual SiH% in the insulating film was 70%, confirming that conversion to silica had occurred. No abnormalities, i.e., cracks and so forth, were observed in the film. The dielectric constant of the insulating film was 2.2.

Example 6

10 wt % dodecylbenzene was added to an organic spin-on glass (OCD-Type 7 from Tokyo Oka Kogyo Kabushiki Kaisha). A film with a thickness of 6,300 angstroms was formed by spin coating the solution on a silicon wafer at a preliminary rotation of 500 rpm for 3 seconds and a main rotation of 3,000 rpm for 10 seconds followed by standing at room temperature for 10 minutes. The wafer was baked in an air current at 250° C. for 1 hour in a quartz oven, withdrawn, and allowed to stand at room temperature for 10 minutes. At this point the solubility of the film in methyl isobutyl ketone was lower than that post-spin coating. The wafer was annealed for 1 hour at 400° C. in a quartz oven under a current of nitrogen containing 10 ppm oxygen and withdrawn and allowed to stand at room temperature for 10 minutes. No abnormalities, i.e., cracks and so forth, were observed in the film. The dielectric constant of the film was 2.7.

Example 7

Hydrogen silsesquioxane resin (number-average molecular weight=1,540 and weight-average molecular weight=7, 705) synthesized according to the method described in Example 1 of Japanese Patent Publication (Kokoku) Number Sho 47-31838 (U.S. Pat. No. 3,615,272) was dissolved in methyl isobutyl ketone to prepare the 26 wt % (solids) solution. To this was added dodecylbenzene at 10 wt % based on the methyl isobutyl ketone solution and chloroplatinic acid hexahydrate at 100 weight-ppm based on the resin. A film with a thickness of 6,200 angstroms was prepared by spin coating the solution on a silicon wafer at a preliminary rotation of 500 rpm for 3 seconds and a main rotation of 3,000 rpm for 10 seconds followed by holding at room temperature for 10 minutes. The wafer was baked for 1 hour at 250° C. in a quartz oven under an air current, withdrawn, and allowed to stand at room temperature for 10 minutes. At this point the solubility of the film in methyl isobutyl ketone was less than that post-spin coating. The wafer was annealed at 400° C. for 1 hour in a quartz oven under a current of nitrogen containing 10 ppm oxygen, withdrawn and allowed to stand at room temperature for 10 minutes. The residual SiH% in the film was 75%, confirming that conversion to silica had occurred. No abnormalities, i.e., cracks and so forth, were observed in the film. The dielectric constant of the film was 2.4.

Example 8

The H-resin fraction prepared in Example 1 was dissolved in methyl isobutyl ketone to prepare the 22 wt % (solids) solution. To this was added dodecylbenzene at 10 wt % and polyoxyethylene lauryl ether at 1 wt %, based on the methyl isobutyl ketone solution. A film with a thickness of 6,450 angstroms was produced by spin coating the solution on a silicon wafer at a preliminary rotation of 500 rpm for 3 seconds and then at a main rotation of 3,000 rpm for 10 seconds followed by standing for 10 minutes at room temperature.

Example 9

The H-resin fraction prepared in Example 1 was dissolved in methyl isobutyl ketone to prepare the 22 wt % (solids) solution. To this was added cyclohexylbenzene at 10 wt % based on the methyl isobutyl ketone solution. A film with a thickness of 6,300 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was baked for 1 hour at 400° C. in a quartz oven under a current of nitrogen containing 10 ppm oxygen, withdrawn and held for 10 minutes at room temperature. The residual SiH% in the film was 77%, confirming that conversion to silica had occurred. No abnormalities, i.e., cracks and so forth, were observed in the film. The dielectric constant of the film was 2.4.

Example 10

The H-resin fraction prepared in Example 1 was dissolved in methyl isobutyl ketone to prepare the 22 wt % (solids) solution. To this was added pentylbenzene at 10 wt % based on the methyl isobutyl ketone solution and chloroplatinic acid hexahydrate at 100 weight-ppm based on the H-resin fraction. A film with a thickness of 6,500 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was baked for 1 hour at 250° C. in a quartz oven in an air current and withdrawn and held for 10 minutes at room temperature. The residual SiH% in the film was 91%, confirming that conversion to silica had occurred. No abnormalities, i.e., cracks and so forth, were observed in the film. The dielectric constant of the film was 2.7.

Example 11

The H-resin fraction prepared in Example 1 was dissolved in methyl isobutyl ketone to prepare the 18 wt % (solids)

solution. To this was added dodecylbenzene at 10 wt % based on the methyl isobutyl ketone solution and chloroplatinic acid hexahydrate at 100 weight-ppm based on the H-resin fraction. The solution was spin coated on a patterned polysilicon wafer (feature height=0.5 μm, feature width and feature spacing=0.18 μm) at a preliminary rotation of 500 rpm for 3 seconds and then a main rotation of 5,000 rpm for 10 seconds. Thorough evaporation of the solvent gave a film with a thickness of 8,235 angstroms at its deepest section. The wafer was heated under a nitrogen current on a hot plate using the sequence of 150° C./1 minute, 200° C./1 minute, and 200° C./1 minute in the order given. This resulted in fluidization with thorough gapfilling between the features and thorough planarization of the resin surface. The wafer was baked for 1 hour at 250° C. in a quartz oven under an air current, removed, and allowed to stand at room temperature for 10 minutes. At this point the solubility of the film in methyl isobutyl ketone was less than that post-spin coating. The wafer was annealed at 400° C. for 1 hour in a quartz oven under a current of nitrogen containing 10 ppm oxygen, withdrawn and held at room temperature for 10 minutes. No abnormalities, i.e., cracks and so forth, were observed in the film.

Example 12

A fluorinated polyallyl ether resin was synthesized according to the method described on page 116 of the 1995 Proceedings of the Twelfth International VLSI Multilevel Interconnection Conference. Analysis of the resin product by GPC gave a number-average molecular weight of 2,540 and a weight-average molecular weight of 9,390. This resin was dissolved in methyl isobutyl ketone to prepare the 26 wt % (solids) solution. To this was added dodecylbenzene at 10 wt % based on the methyl isobutyl ketone solution. A film with a thickness of 6,080 angstroms was prepared by spin coating the solution on a silicon wafer at a preliminary rotation of 500 rpm for 3 seconds and then a main rotation of 3,000 rpm for 10 seconds followed by standing for 10 minutes at room temperature. The wafer was baked for 1 hour at 250° C. in a quartz oven under an air current, removed, and allowed to stand at room temperature for 10 minutes. At this point the solubility of the film in methyl isobutyl ketone was less than that post-spin coating. The wafer was annealed at 400° C. for 1 hour in a quartz oven under a current of nitrogen containing 10 ppm oxygen, withdrawn and held at room temperature for 10 minutes. The solubility of the film in methyl isobutyl ketone was found to have undergone further decline. The film had a dielectric constant of 2.4.

Comparative Example 1

The H-resin fraction prepared in Example 1 was dissolved in methyl isobutyl ketone to prepare the 22 wt % (solids) solution. A film with a thickness of 6,078 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was annealed for 1 hour at 400° C. in a quartz oven under a current of nitrogen containing 10 ppm oxygen, withdrawn and held for 10 minutes at room temperature. The residual SiH% in the film was 75%, confirming that conversion to silica had occurred. The production of cracks in the film was observed. The dielectric constant of the film was 2.8.

Comparative Example 2

The H-resin fraction prepared in Example 1 was dissolved in methyl isobutyl ketone to prepare the 35 wt % (solids) solution. A film with a thickness of 13,200 angstroms was produced by spin coating the solution on a silicon wafer at a preliminary rotation of 500 rpm for 3 seconds and then at a main rotation of 2,000 rpm for 10 seconds followed by standing for 10 minutes at room temperature. The wafer was annealed for 1 hour at 400° C. in a quartz oven under a current of nitrogen containing 10 ppm oxygen, withdrawn and held for 10 minutes at room temperature. The residual SiH% in the film was 75%, confirming that conversion to silica had occurred. The production of cracks in the film was observed. The dielectric constant of this thin film was 2.8.

What is claimed is:

1. A composition for forming electrically insulating thin films comprising
   (A) an electrically insulating curable resin selected from the group consisting of electrically insulating curable organic resins and electrically insulating curable inorganic resins; and
   (B) a solvent mixture comprising
      (i) a solvent capable of dissolving resin (A) and
      (ii) a solvent selected from the group consisting of solvents whose boiling point differs from solvent (i), solvents whose vapor pressure curve differs from that of solvent (i) and solvents whose affinity for resin (A) differs from that of solvent (i).

2. The composition as claimed in claim 1 wherein resin (A) is hydrogen silsesquioxane resin.

3. The composition as claimed in claim 1 wherein the composition additionally contains (C) a cure-accelerating catalyst for component (A).

4. The composition as claimed in claim 3 wherein (C) is selected from a platinum compound or transition metal compound.

5. The composition as claimed in claim 1 wherein solvent (B)(i) is selected from the group consisting of aromatic solvents, aliphatic solvents; ketone solvents, aliphatic ester solvents, silicone solvents, and silanes.

6. The composition as claimed in claim 5 wherein the solvent is a ketone solvent.

7. The composition as claimed in claim 6 wherein the solvent is methyl isobutyl ketone.

8. The composition as claimed in claim 5 wherein the solvent is a silicone solvent.

9. The composition as claimed in claim 1 wherein the solvent (B)(ii) is a solvent having a higher boiling point than solvent (B)(i).

10. The composition as claimed in claim 9 wherein the solvent (B)(ii) is selected from the group consisting of hydrocarbon solvents ketone solvents; aldehyde solvents; ester solvents; diethyl sulfate; sulfolane; halohydrocarbon solvents; etherified hydrocarbon solvents; alcohol solvents; ether solvents; acetal solvents; polyhydric alcohol solvents; carboxylic anhydride solvents; phenolic solvents; and silicone solvents.

11. The composition as claimed in claim 1 wherein solvent (B)(i) is methyl isobuytyl ketone and solvent (B)(ii) is dodecylbenzene.

12. The composition as claimed in claim 1 wherein solvent (B)(i) is methyl isobuytyl ketone and solvent (B)(ii) is diethyl phthalate.

13. The composition as claimed in claim 1 wherein solvent (B)(i) is methyl isobuytyl ketone and solvent (B)(ii) is cyclohexylbenzene.

14. The composition as claimed in claim 1 wherein solvent (B)(i) is methyl isobuytyl ketone and solvent (B)(ii) is pentylbenzene.

15. The composition as claimed in claim 1 wherein solvent (B)(i) is a silicone solvent and solvent (B)(ii) is dodecylbenzene.

16. The composition as claimed in claim 1 wherein the solvent mixture (B) is present at 50 wt % per 100 weight parts resin (A).

17. A process for forming electrically insulating thin films comprising
   (I) coating the surface of a substrate with a composition for forming electrically insulating thin films comprising
      (A) an electrically insulating curable resin selected from the group consisting of electrically insulating curable organic resins and electrically insulating curable inorganic resins; and
      (B) a solvent mixture comprising
         (i) a solvent capable of dissolving resin (A) and
         (ii) a solvent selected from the group consisting of a solvent whose boiling point differs from solvent (i), a solvent whose vapor pressure curve differs from that of solvent (i) and a solvent whose affinity for resin (A) differs from that of solvent (i);
   (II) evaporating at least a portion of the solvent mixture (B); and
   (III) heating the substrate to induce gasification of the remaining component (B) during the course of or after the cure of the said resin (A).

18. The process as claimed in claim 17 wherein the substrate is an electronic device.

19. The process as claimed in claim 17 wherein the coating of the surface is by spin coating.

20. The process as claimed in claim 17 wherein the substrate is heated in (III) to a temperature higher than the melting point of the resin (A).

* * * * *